(12) United States Patent
Lee et al.

(10) Patent No.: US 7,020,294 B2
(45) Date of Patent: Mar. 28, 2006

(54) METHOD FOR ACTIVE NOISE CANCELLATION USING INDEPENDENT COMPONENT ANALYSIS

(75) Inventors: Soo Young Lee, Taejon (KR); Hyung Min Park, Taejon (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 795 days.

(21) Appl. No.: 09/808,055

(22) Filed: Mar. 15, 2001

(65) Prior Publication Data

US 2002/0114472 A1 Aug. 22, 2002

(30) Foreign Application Priority Data

Nov. 30, 2000 (KR) ................................ 2000-72042

(51) Int. Cl.
*H04B 15/00* (2006.01)
(52) U.S. Cl. .................................................... 381/94.7
(58) Field of Classification Search ........ 381/71.1–71.2, 381/71.5, 71.7–71.9, 71.11–71.14, 94.7, 94.9, 381/95
See application file for complete search history.

(56) References Cited

U.S. PATENT DOCUMENTS

| | | | | |
|---|---|---|---|---|
| 4,672,674 A * | 6/1987 | Clough et al. ............. 381/94.7 |
| 5,243,661 A * | 9/1993 | Ohkubo et al. ............ 381/94.2 |
| 5,675,659 A * | 10/1997 | Torkkola ...................... 381/94 |
| 6,151,397 A * | 11/2000 | Jackson et al. ............ 381/71.4 |
| 6,266,422 B1 * | 7/2001 | Ikeda ...................... 381/71.11 |
| 6,430,295 B1 * | 8/2002 | Handel et al. ............. 381/94.7 |

* cited by examiner

*Primary Examiner*—Vivian Chin
*Assistant Examiner*—Lun-See Lao
(74) *Attorney, Agent, or Firm*—Bacon & Thomas, PLLC

(57) ABSTRACT

The present invention considers a method for active cancellation using independent component analysis. More particularly, the present invention relates to a method which is operable the independent component analysis technique to an adaptive algorithm that can consider secondary or more higher statistical characteristics.

The conventional active noise cancellation systems mainly use the LMS(Least Mean Square) which considers secondary statistics among input signals.

Being different from the conventional active noise cancellation systems, the present invention provides a method for active noise cancellation using independent component analysis, which makes output signals independent of each other by considering secondary or more higher statistical characteristics.

Therefore, according to the present invention, the improved performances of the noise cancellation systems can be provided compared with the conventional active noise cancellation system which uses the LMS adaptive algorithm.

3 Claims, 2 Drawing Sheets

METHOD FOR ACTIVE NOISE CANCELLATION USING INDEPENDENT COMPONENT ANALYSIS

BACKGROUND OF THE INVENTION

1. Field of the Invention

The present invention considers a method for active noise cancellation using independent component analysis. More particularly, the present invention relates to a method which is operable the independent component analysis technique to an adaptive algorithm that can consider secondary or more higher statistical characteristics.

2. Description of the Related Art

FIG. 1 shows a structure of a general active noise cancellation system. In FIG. 1, a signal source(10) s is transmitted to a sensor through a channel, and a noise source(20) $n_0$ is input in the sensor so that the combined signal and noise s+$n_0$ form primary input(30) in the noise cancellation system.

The secondary sensor receives noise $n_1$ through another channel, and the sensor forms reference input(40) in the noise cancellation system. The noise $n_1$ is filtered to produce an output z, which is as close as possible of $n_0$, by passing through an adaptive filter(50), and the primary input s+$n_0$ deducts output z through an adder(60) and forms system output(70) u=s+$n_0$−z in the noise cancellation system.

The purpose of the conventional active noise cancellation is to get output u=s+$n_0$−z which is as close as possible of signal s in the point of least squares. To reach the purpose, the filter is adapted using a least mean square(LMS) adaptive algorithm to minimize the entire output of the noise cancellation system. In other words, the output in the active noise cancellation system is operated as an error signal during adaptation.

The coefficient adaptation of the filter follows the Widrow-Hoff LMS algorithm and can be expressed as following expression.

$$\Delta w(k) \alpha u(t) n_1(t-k) \qquad \text{[Expression 1]}$$

Where, w(k) is $k^{th}$ order coefficient, and t is sample index.

SUMMARY OF THE INVENTION

The purpose of the present invention is to provide a method for active noise cancellation using independent component analysis, which allows to get the improved performances of the noise cancellation systems compared with the conventional LMS adaptive algorithm.

To reach the said purpose of the present invention, being different from the conventional noise cancellation systems, the present invention provides a method for active noise cancellation using independent component analysis, which makes output signals independent of each other by considering secondary or more higher statistical characteristics.

DETAILED DESCRIPTION OF THE EMBODIMENTS

Hereafter, an embodiment according to the present invention is described in detail by referring to accompanying drawings.

Figure 2:
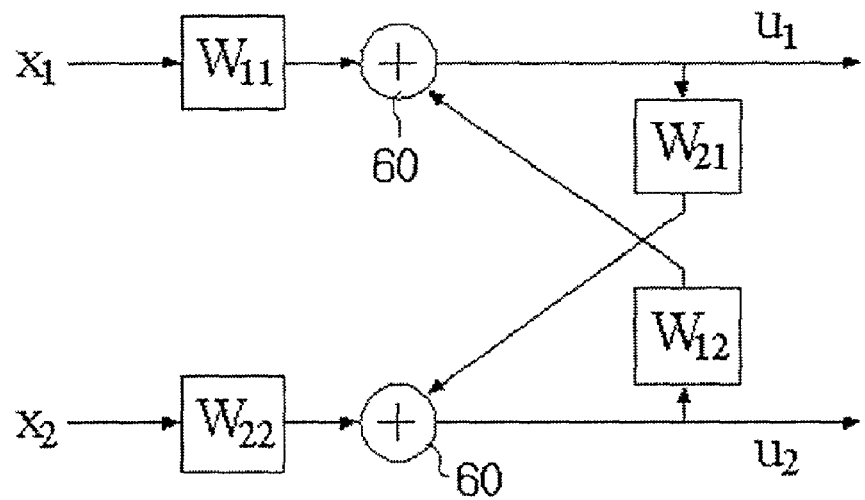
FIG. 2 shows a structure of a feedback filter according to the present invention.
Figure 3:
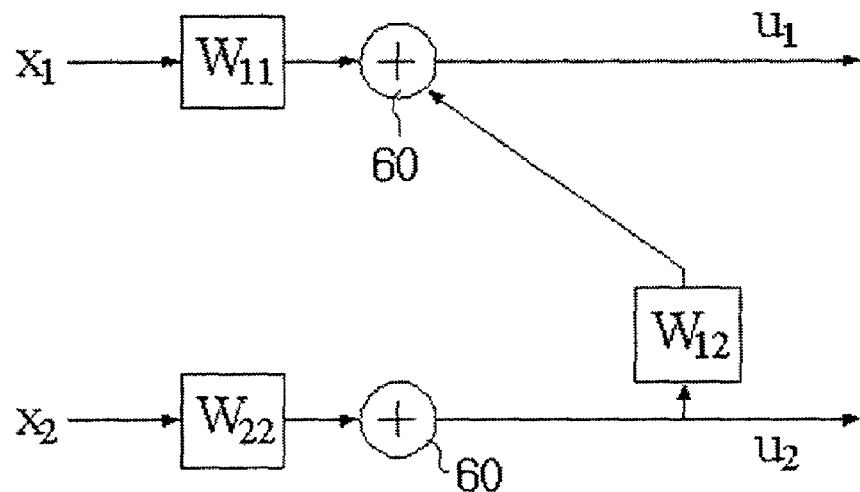
FIG. 3 shows a structure of a feedback filter for active noise cancellation according to the present invention.

FIG. 2 shows a structure of a feedback filter according to the present invention, and FIG. 3 shows a structure of a feedback filter for active noise cancellation according to the present invention.

Independent component analysis can recover unobserved independent source signals from the combined signals of sound sources which are mixed through an unknown channel. Let us consider a set of unknown sources, s(t)=$[s_1(t), s_2(t), \ldots, s_N(t)]^T$, such that the components $s_i(t)$ are zero-mean and mutually independent. From N sensors, it is obtained a set of signals, x(t)=$[x_1(t), x_2(t), \ldots, x_N(t)]^T$, which are mixed through a channel from the sources, s(t)=$[s_1(t), s_2(t), \ldots, s_N(t)]^T$. If a channel can be modeled as instantaneous mixing, the sensor signals, x(t)=$[x_1(t), x_2(t), \ldots, x_N(t)]^T$, can be expressed as following expression.

$$x(t) = A \cdot s(t) \qquad \text{[Expression 2]}$$

Where, A is an unknown invertable matrix called as a mixing matrix.

Therefore, it is the subject to retrieve the sound sources by finding the inverse matrix of the mixing matrix A using only sensor signals x(t).

However, recovering a permuted and rescaled version of original sound sources doesn't matter from the standpoint of source separation because it doesn't affect their waveforms.

Therefore, by estimating the unmixing matrix W, the retrieved signals u(t), which are the original ones up to permutation and scaling, is acquired from the following expression.

$$u(t) = W \cdot x(t) \qquad \text{[Expression 3]}$$

Herein, to estimate the unmixing matrix W, it is assumed that each of sound sources is independent. It means that a signal from one sound source doesn't affect a signal from another source, and it can be considered as possible suppose. Also, the statistical independence includes the statistical characteristics of all orders.

Because the statistical independence doesn't affect permutation and scaling, the unmixing matrix W of expression 3 can be obtained. The unmixing matrix W is learned by using the following expression which makes the statistical independence among estimated source signals maximize.

$$\Delta W \propto [W^T]^{-1} - \varphi(u) x^T, \; \varphi(u_i(t)) = -\frac{\frac{\partial u_i(t)}{P(u_i(t))}}{} \qquad \text{[Expression 4]}$$

Where, $P(u_i(t))$ approximates the probability density function of estimated source signal $u_i(t)$.

In real world situations, instantaneous mixing is hardly encountered, and the mixing of sources involves convolution and time-delays as following expression.

$$x_1(t) = \sum_{j=1}^{N} \sum_{k=0}^{K-1} a_{ij}(k) s_j(t-k) \qquad \text{[Expression 5]}$$

Where, $x_i(t)$ is a measured sensor signal, $s_j(t)$ is a sound source signal, and $a_{ij}(k)$ is a coefficient of a mixing filter of length K.

To separate the source signals, the feedback filter structure of FIG. 2 can be used. Where, the recovered signal $u_i(t)$ can be expressed as following.

$$u_i(t) = \sum_{k=0}^{K} w_{ij}(k)x_1(t-k) + \sum_{j=1,j\neq i}^{N} \sum_{k=1}^{K} w_{ij}(k)u_j(t-k) \quad \text{[Expression 6]}$$

Where, $w_{ij}(k)$ shows $k^{th}$ order coefficient of the filter to estimate an original sound sources.

In this structure, there are three different cases of the filter coefficients. In other words, these are $w_{ii}(0)$ which is a zero delay coefficient in a direct filter, $w_{ii}(k)$, $k\neq 0$ which is a delay coefficient in a direct filter, and $w_{ij}(k)$, $i\neq j$ which is a coefficient in a feedback cross filter. Learning rules for all these cases are as following.

$$\Delta w_{ii}(0) \propto 1/w_{ii}(0) - \varphi(u_i(t))x_i(t), \quad \text{[Expression 7]}$$

$$\Delta w_{ii}(k) \propto -\varphi(u_i(t))x_i(t-k),$$

$$\Delta w_{ij}(k) \propto -\varphi(u_i(t))u_j(t-k), \varphi(u_i(t)) = -\frac{\frac{\partial P(u_i(t))}{\partial u_i(t)}}{P(u_i(t))}$$

Zero delay coefficient, $w_{ii}(0)$, scales the data to maximize the information transmitted through the nonlinear function, delay coefficient, $w_{ii}(k)$, $k\neq 0$, whitens each output from the corresponding input signal temporally, and coefficient in a feedback cross filter, $w_{ij}(k)$, $i\neq j$, decorrelates each output $\phi(u_j(t))$ from all other recovered signal $u_j(t)$.

FIG. 2 shows the feedback filter structure with two inputs and outputs. However, by increasing the number of inputs and outputs in the feedback filter structure, a feedback filter structure can be constructed with an arbitrary number of inputs and outputs. And, in this structure, the same expressions as expression 5, 6, and 7 that show the mixed signals, recovered signals, and learning rules of filter coefficients can be used.

For the convolved mixtures, the recovered signals are the whitened origin source signals temporally. Therefore, whitening problem can be solved by remaining zero delay coefficient, $w_{ii}(0)$, and fixing delay coefficient, $w_{ii}(k)$, $k\neq 0$.

In case that pure noise can be observed, noise component from mixed signal can be canceled by using independent component analysis.

Figure 1:
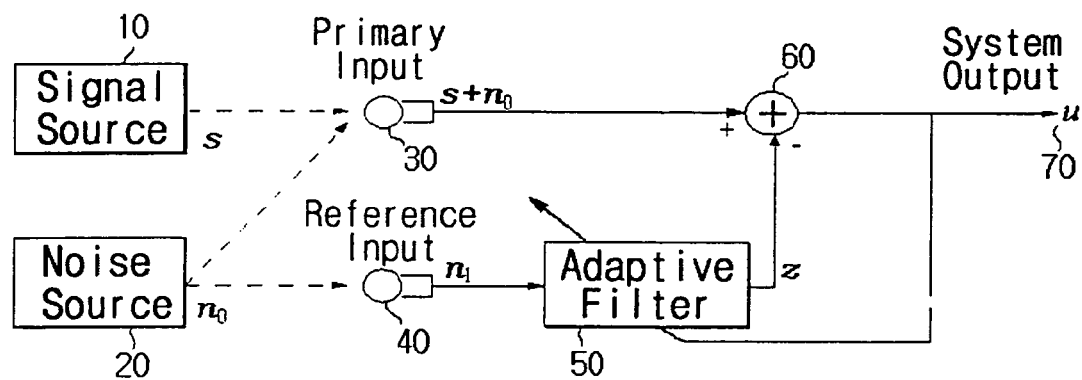
FIG. 1 shows a structure of a general active noise cancellation system.

In FIG. 1, which shows basic active noise cancellation, it can be assumed that noise $n_1$ and signal s are independent to each other, but noise $n_1$ is related to noise $n_0$ in unknown way. Because signal and noise do not affect each other, this assumption is reasonable.

Independent component analysis can be used to cancel noise dependent component of primary input by the secondary input. The primary input is the mixed signal of noise and signal, and the secondary input is noise component without signal component, therefore, the feedback filter structure for independent component analysis can be modified.

In other words, when the primary and secondary input are $x_1$ and $x_2$ respectively like in FIG. 2, the secondary input $x_2$ is the noise component without signal component, so it is not required feedback filter $W_{21}(k)$ of expression 6.

The feedback filter structure, which has two inputs and outputs that do not use feedback filter $w_{21}(k)$, is shown as the structure of FIG. 3 and can be expressed as following expression.

$$u_1(t) = \sum_{k=0}^{K} w_{11}(k)x_1(t-k) + \sum_{k=1}^{K} w_{12}(k)u_2(t-k), \quad \text{[Expression 8]}$$

$$u_2(t) = \sum_{k=0}^{K} w_{22}(k)x_2(t-k)$$

By comparing FIG. 1 which shows basic active noise cancellation system and FIG. 3, the mixture $s+n_0$ of signal and noise, which forms the primary input, is corresponding to $x_1$, whereas $n_1$, which forms the secondary input, is corresponding to $x_2$. Also, output u is corresponding to $u_1$.

Herein, in case of remaining zero delay coefficient, $w_{ii}(0)$, and fixing delay coefficient, $w_{ii}(k)$, $k\neq 0$ to 0, because feedback filter $w_{21}(k)$ is not used, output signal $u_1$ of expression 8 corresponding to output u of the conventional active noise cancellation system can be expressed using two inputs $x_1$ and $x_2$ as following.

$$u_1(t) = w_{11}(0)x_1(t) + w_{22}(0)\sum_{k=1}^{K} w_{12}(k)x_2(t-k) \quad \text{[Expression 9]}$$

The second term of the expression 9 corresponds to output z of the adaptive filter in the conventional active noise cancellation system. Therefore, the feedback filter structure of independent component analysis for active noise cancellation can be considered as the same structure of the conventional active noise cancellation system.

The learning rule of each filter coefficient for an active noise cancellation system can be expressed by independent component analysis as following.

$$\Delta w_u(O) \propto 1/w_u(O) - \varphi(u_i(t))x_i(f), \quad \text{[Expression 10]}$$

$$\Delta w_u(k) \propto -\varphi(u_i(r))x_i(t-k),$$

$$\Delta w_{ij}(k) \propto -\varphi(u_i(t))u_j(t-k), \varphi(u_i(t)) = \frac{\frac{\partial P(u_i(t))}{\partial u_i(t)}}{P(u_i(t))}$$

Output of the active noise cancellation system obtained by learning filter coefficients is signal component which is independent of noise component.

In FIG. 3, the feedback filter structure for active noise cancellation with two inputs and outputs can be extended to an structure with arbitrary number of inputs and outputs like in FIG. 2, and the recovered signals and learning rules of coefficients in the said feedback filter structure for active noise cancellation which has arbitrary number of inputs and outputs can be obtained by extending expression 8 and 10 in the same way.

As mentioned above, the method for active noise cancellation using independent component analysis according to the present invention provides the improved noise cancellation performances compared with those of the active noise cancellation system which uses the conventional LMS adaptive algorithm.

What is claimed is:

1. The method for active noise cancellation using independent component analysis which is characterized by controlling active noise by learning each adaptive filter coefficient according to the following expression in active noise cancellation system, wherein the mixture $x_1$ of signal and noise that forms the primary input and noise $x_2$ that forms the secondary input is related by the following expression:

$$\Delta w_{ii}(0) \propto 1/w_{ii}(0) - \varphi(u_i(t))x_i(t), \quad \text{[Expression 7]}$$

$$\Delta w_{ii}(k) \propto -\varphi(u_i(t))x_i(t-k),$$

$$\Delta w_{ij}(k) \propto -\varphi(u_i(t))u_j(t-k), \quad \varphi(u_i(t)) = -\frac{\frac{\partial P(u_i(t))}{\partial u_i(t)}}{P(u_i(t))}$$

wherein, the said $w_{ii}(0)$ is a zero delay coefficient in a direct filter, $w_{ii}(k)$, $k \neq 0$ is a delay coefficient in a direct filter, $w_{ij}(k)$, $i \neq j$ is a coefficient in a feedback cross filter, $\Delta$ before each coefficient is a change amount of the corresponding coefficient, t is sample index, and $P(u_i(t))$ approximates the probability density function of estimated source signal $u_i(t)$.

2. The method for active noise cancellation using independent component analysis according to claim 1, which is characterized by obtaining the said $u_i(t)$ by following expression:

$$u_1(t) = \sum_{k=0}^{K} w_{11}(k)x_1(t-k) + \sum_{k=1}^{K} w_{12}(k)u_2(t-k),$$

$$u_2(t) = \sum_{k=0}^{K} w_{22}(k)x_2(t-k).$$

3. The method for active noise cancellation using independent component analysis according to claim 1, wherein signal cancellation range corresponding to active noise is extended for the system which acquires many noise signals or mixtures of signal and noise by increasing the number of inputs or outputs of the said active noise cancellation system.

* * * * *